United States Patent
Lim

(10) Patent No.: US 8,436,659 B1
(45) Date of Patent: May 7, 2013

(54) CIRCUITS AND METHODS FOR REDUCING ELECTRICAL STRESS ON A TRANSISTOR

(75) Inventor: Kah Hooi Lim, Pulau Pinang (MY)

(73) Assignee: Marvell International Ltd., Hamilton (BM)

(*) Notice: Subject to any disclaimer, the term of this patent is extended or adjusted under 35 U.S.C. 154(b) by 77 days.

(21) Appl. No.: 12/487,994

(22) Filed: Jun. 19, 2009

Related U.S. Application Data

(60) Provisional application No. 61/075,198, filed on Jun. 24, 2008.

(51) Int. Cl.
*H03K 5/22* (2006.01)

(52) U.S. Cl.
USPC .................. 327/68; 327/72; 327/73; 327/206

(58) Field of Classification Search .................... 327/68, 327/206, 72, 73
See application file for complete search history.

(56) References Cited

U.S. PATENT DOCUMENTS

| | | | | |
|---|---|---|---|---|
| 5,276,646 A | * | 1/1994 | Kim et al. | 365/189.09 |
| 5,467,009 A | * | 11/1995 | McGlinchey | 323/269 |
| 5,856,756 A | * | 1/1999 | Sasahara et al. | 327/540 |
| 5,923,219 A | * | 7/1999 | Ide et al. | 330/308 |
| 6,111,443 A | * | 8/2000 | Mores et al. | 327/206 |
| 6,147,521 A | * | 11/2000 | Degoirat et al. | 327/81 |
| 6,335,641 B1 | * | 1/2002 | Tougou | 327/73 |
| 6,828,828 B2 | * | 12/2004 | Marshall et al. | 327/68 |
| 6,870,403 B2 | * | 3/2005 | Horie et al. | 327/63 |
| 6,940,315 B2 | * | 9/2005 | Wang et al. | 327/52 |
| 7,034,598 B2 | * | 4/2006 | Cho | 327/277 |
| 7,251,169 B2 | * | 7/2007 | Takeuchi | 365/189.09 |
| 7,260,057 B2 | * | 8/2007 | Toyoshima et al. | 370/211 |
| 7,298,182 B2 | * | 11/2007 | Kim | 327/77 |
| 7,298,200 B2 | * | 11/2007 | Won | 327/541 |
| 7,307,469 B2 | * | 12/2007 | Yamada et al. | 327/540 |
| 7,342,434 B2 | * | 3/2008 | Wakayama et al. | 327/530 |
| 7,352,221 B1 | * | 4/2008 | Bui | 327/205 |
| 7,355,488 B2 | * | 4/2008 | Park | 331/57 |
| 7,358,776 B2 | * | 4/2008 | Matsumoto | 327/18 |
| 7,425,844 B1 | * | 9/2008 | Chung et al. | 326/68 |
| 7,427,890 B2 | * | 9/2008 | Chan | 327/536 |
| 7,446,574 B2 | * | 11/2008 | Ohira | 327/73 |
| 7,455,452 B2 | * | 11/2008 | Seo | 374/171 |

* cited by examiner

*Primary Examiner* — Kenneth B. Wells

(57) ABSTRACT

Embodiments of the present invention include an electronic circuit that reduces stress on a transistor. In one embodiment, the electronic circuit comprises a transistor and a reference generator circuit. The transistor may be a metal oxide semiconductor (MOS) transistor, for example. The MOS transistor has a gate terminal to receive an input voltage. The reference generator circuit selectively couples first and second reference voltages to a source terminal of the MOS transistor. The reference generator circuit senses the input voltage and provides the first reference voltage to the source terminal of the MOS transistor if the input voltage is greater than a threshold and the second reference voltage is coupled to the source terminal of the first MOS transistor if the input voltage is less than a threshold.

13 Claims, 5 Drawing Sheets

CIRCUITS AND METHODS FOR REDUCING ELECTRICAL STRESS ON A TRANSISTOR

CROSS REFERENCE TO RELATED APPLICATIONS

This application claims the benefit of U.S. Provisional Application No. 61/075,198, filed Jun. 24, 2008, the disclosure of which is incorporated herein by reference.

BACKGROUND

The present invention relates to circuits and methods for reducing electrical stress on a transistor.

Integrated circuits are typically built using transistors, such as metal oxide semiconductor (MOS) transistors, for example. Over the years, the number of transistors on an integrated circuit has increased significantly. The increase in transistor density has led to many benefits and challenges. For example, as devices are made smaller, the susceptibility of such devices to electrical stress and breakdown increases.

FIG. 1 illustrates a structure of a traditional MOS transistor 100. MOS transistor 100 includes p-type region 105 having a portion acting as a channel, an n+ type source region 103, and an n+ drain region 104. Dielectric layer 102 covers portions of n+ type source region 103 and n+ type drain region 104 and covers the portion of the p-type region 105 acting as a channel. Above dielectric layer 102 is a poly-silicon layer 101. As the dimensions of transistor 100 are reduced, the dimensions of the regions specified above are also reduced. In particular, as the transistor size is reduced, the dielectric layer 102 may be manufactured thinner. However, the thinner dielectric may also make the transistor gate more vulnerable to gate dielectric stress when voltages are applied across the gate and source terminals. Such stress may cause damage to the dielectric and damage the device.

Therefore, it would be desirable to reduce electrical stress on a transistor. The present invention solves these and other problems by providing circuits and methods for reducing stress on a transistor.

SUMMARY

Embodiments of the present invention reduce stress on a transistor. In one embodiment, the present invention includes an electronic circuit comprising a transistor having a first terminal, a second terminal, and a control terminal, wherein the control terminal is configured to receive an input voltage, and a reference generator circuit coupled to the first terminal of the transistor, the reference generator circuit selectively coupling first and second reference voltages to the first terminal of the transistor. The reference generator circuit senses the input voltage and couples the first reference voltage to the first terminal of the transistor if the input voltage meets a threshold and couples the second reference voltage to the first terminal of the transistor if the input voltage does not meet the threshold.

In one embodiment, the circuit further comprises a second transistor having a first terminal coupled to the first terminal of the first transistor and a control terminal coupled to the reference generator circuit to receive the first and second reference voltages.

In one embodiment, the reference generator circuit includes a third transistor to selectively couple the first reference voltage to the control terminal of the second transistor, and wherein the reference generator circuit includes a fourth transistor to selectively couple the second reference voltage to the control terminal of the second transistor.

In one embodiment, the input voltage transitions from a first voltage level to a second voltage level, and wherein a difference between the first voltage level and the second reference voltage is less than one-half of a difference between the first voltage level and the second voltage level.

In one embodiment, the reference generator circuit includes an inverter to set the threshold.

In one embodiment, the threshold is a voltage less than the first and second reference voltages.

In one embodiment, the transistor is a metal oxide semiconductor (MOS) transistor.

In one embodiment, the transistor is an LDMOS transistor.

In one embodiment, the electronic circuit is a comparator.

In one embodiment, the input voltage meets the threshold if the input voltage is greater than the threshold, and the input voltage does not meet the threshold if the input voltage is less than the threshold.

In another embodiment, the present invention includes a method comprising sensing an input voltage on a control terminal of a transistor and selectively coupling first and second reference voltages to a first terminal of the transistor. The first reference voltage is coupled to the first terminal of the transistor if the input voltage meets a threshold and the second reference voltage is coupled to the first terminal of the transistor if the input voltage does not meet the threshold.

In one embodiment, the first and second reference voltages are coupled to a control terminal of a second transistor, and wherein the second transistor has a first terminal coupled to the control terminal of the first transistor.

In one embodiment, the method further comprises activating a third transistor to couple the first reference voltage to the control terminal of the second transistor and activating a fourth transistor to couple the second reference voltage to the control terminal of the second transistor.

In one embodiment, the input voltage transitions from a first voltage level to a second voltage level, and wherein a difference between the first voltage level and the second reference voltage is less than one-half of a difference between the first voltage level and the second voltage level In one embodiment, the threshold is a voltage less than the first and second reference voltages.

In another embodiment, the present invention includes a circuit comprising means for sensing an input voltage on a control terminal of a transistor and means for selectively coupling first and second reference voltages to a first terminal of the transistor. The first reference voltage is coupled to the first terminal of the transistor if the input voltage meets a threshold and the second reference voltage is coupled to the first terminal of the transistor if the input voltage does not meet the threshold.

The following detailed description and accompanying drawings provide a better understanding of the nature and advantages of the present invention.

DETAILED DESCRIPTION

Described herein are techniques for reducing electrical stress on a transistor. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
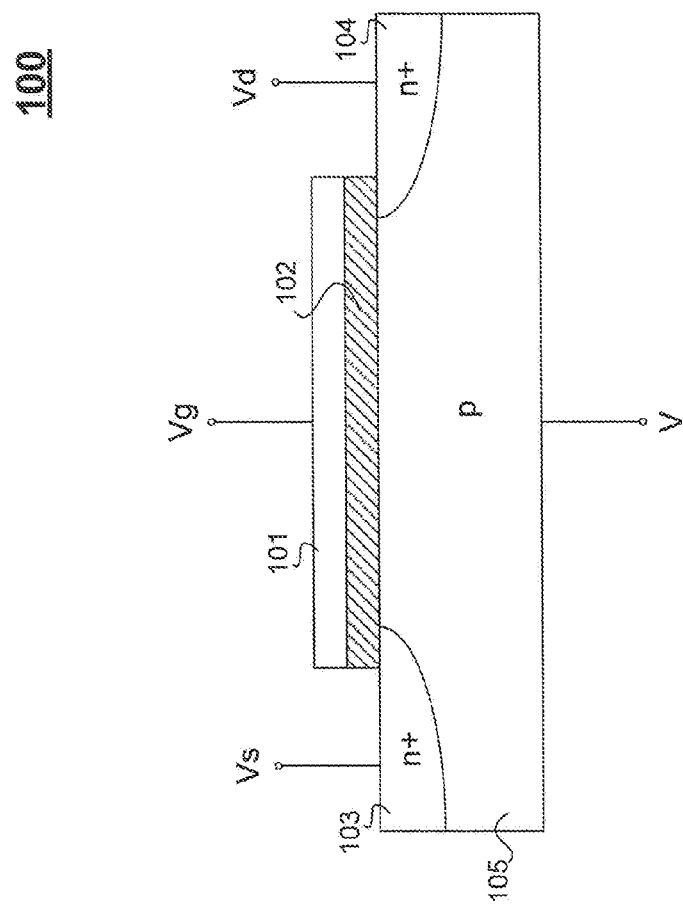
FIG. 1 illustrates a general structure of an example transistor.
Figure 2:
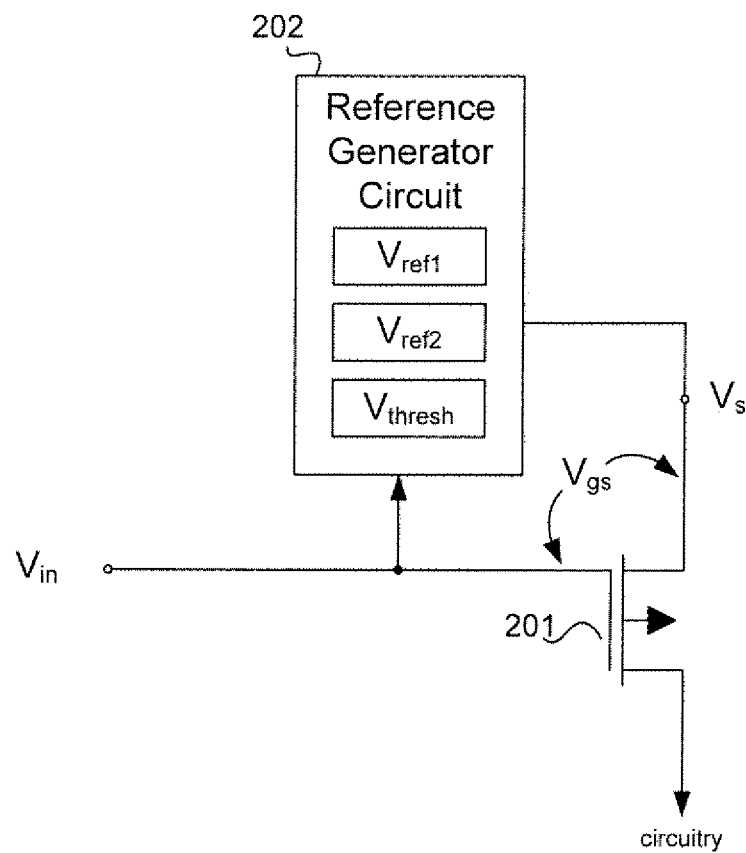
FIG. 2 illustrates an electronic circuit according to one embodiment of the present invention.

FIG. 2 illustrates an electronic circuit 200 according to one embodiment of the present invention. Electronic circuit 200 includes a PMOS transistor 201, and a reference generator circuit 202. While the present example is described using a PMOS transistor, it is to be understood that the present invention may be used to reduce stress on NMOS transistors or other transistors. PMOS transistor 201 has a control terminal (e.g., a gate) to receive input voltage, Vin. Additionally, reference generator circuit 202 receives input voltage, Vin, and selectively couples voltages Vref1 and Vref2 to the source terminal of PMOS transistor 201. Features and advantages of the present invention include sensing the input voltage and coupling the first reference voltage, Vref1, to the source terminal of PMOS transistor 201 if the input voltage meets a threshold voltage (e.g., if the input voltage is greater than Vthresh) and coupling the second reference voltage, Vref2, to the source terminal of PMOS transistor 201 if the input voltage does not meet the threshold (e.g., if the input voltage is less than Vthresh). By modifying the reference voltage applied to the source terminal of the transistor in response to changes of the input voltage, the voltage across the transistor terminals may be maintained below voltage levels that may stress or damage the transistor.

Reference generator circuit 202 may include a threshold voltage, Vthresh, to control when to provide reference voltage Vref1 and when to provide reference voltage Vref2. For example, initially, the input voltage may be at a high voltage level (e.g., 3.3V) above Vthresh (e.g., 1.65V). In this state, the reference generator circuit 202 may couple Vref1 to the source terminal of PMOS transistor 201. In this condition, assuming Vref1 is less than 3.3V, PMOS transistor 201 will be off and the gate terminal will be at a greater voltage than the source terminal. Conversely, the input voltage may transition to a low voltage level (e.g., 0V), which is below Vthresh. Accordingly, the reference generator circuit 202 may couple Vref2 to the source terminal of PMOS transistor 201. In this example, Vref2 is set at a voltage level less than Vref1 so that when the gate of PMOS transistor 201 is at 0V, for example, the reference voltage coupled to the source is reduced and the voltage across the gate terminal to source terminal, Vgs, is reduced. Accordingly, electrical stress on the PMOS transistor is reduced. As set forth in more detail below, example values for Vref1 and Vref2 are as follows:

$V\text{ref1}=1.65V$ $V\text{ref2}=1V.$

In one embodiment, MOS transistor 201 may be a laterally diffused metal oxide semiconductor (LDMOS) transistor. In another embodiment, PMOS transistor 201 may be replaced by an NMOS transistor and the corresponding voltages (e.g. Vref1, Vref2, and Vthresh) may be changed to protect the gate of the NMOS transistor from stress.

Figure 3:
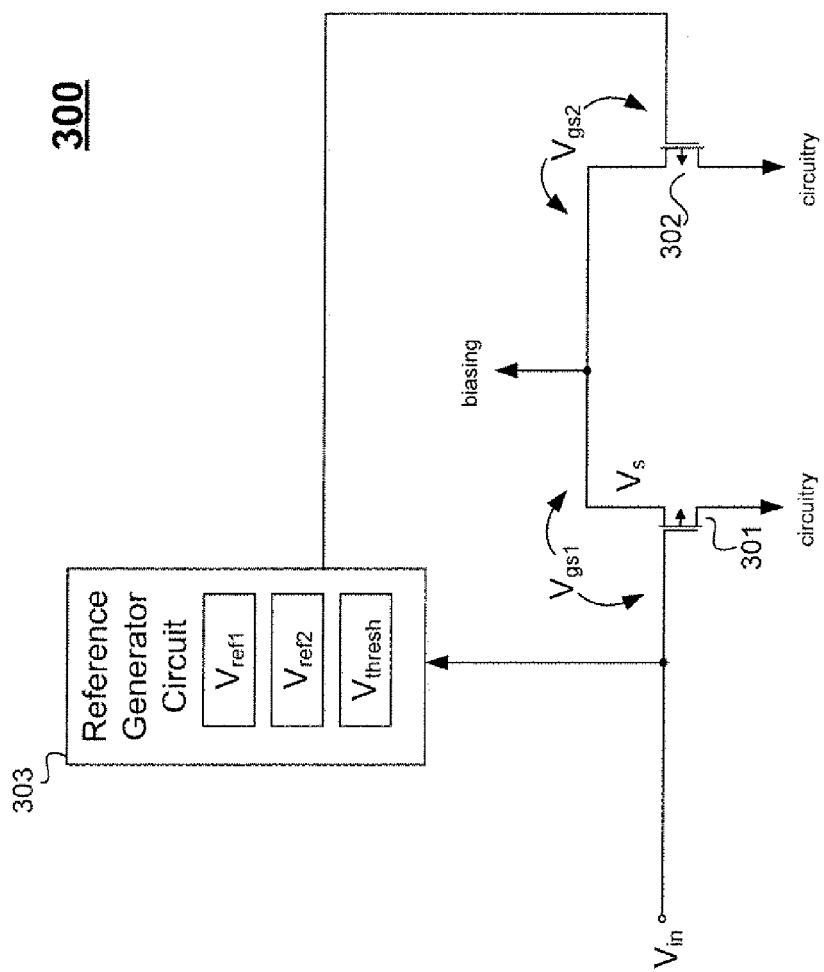
FIG. 3 illustrates an electronic circuit according to another embodiment of the present invention.

FIG. 3 illustrates an electronic circuit 300 according to another embodiment of the present invention. Electronic circuit 300 includes PMOS transistor 301, PMOS transistor 302, and reference generator circuit 303. In this embodiment, reference generator circuit selectively couples reference voltages Vref1 and Vref2 to the gate terminal of PMOS transistor 302 to change the voltage on the source terminal of transistor 301 and reduce electrical stress on the gate to source junction.

Electronic circuit 300 is configured as follows. PMOS transistor 302 has a source terminal coupled to a source terminal of PMOS transistor 301, which forms a differential pair. The source terminal of PMOS transistors 301 and 302 are coupled to a biasing circuit (not shown). The drain terminals of PMOS transistors 301 and 302 are coupled to circuitry, such as a load. Transistors 301 and 302 may form the input terminals of a comparator circuit, for example. A gate terminal of PMOS transistor 301 is coupled to receive input voltage, Vin. The gate terminal of PMOS transistor 301 is further coupled to an input terminal of reference generator circuit 303, which also receives input voltage, Vin. A gate terminal of PMOS transistor 302 receives voltage Vref1 or voltage Vref2 from reference generator circuit 303 based on the input voltage. The reference voltages Vref1 or Vref2 are coupled to the source of PMOS transistor 302 through the gate to source junction of the transistor 302. These voltages may be applied across the gate-to-source junction of PMOS transistor 302, thereby increasing the voltage by Vgs2, to control the gate-to-source voltage of PMOS transistor 301, Vgs1, and reduce stress on PMOS transistor 301.

Reference generator circuit 303 operates as follows. The input voltage is received at the gate of PMOS transistor 301, and is further coupled to the input of reference generator circuit 303. In this example, the input voltage may range from 0V to 3.3V, for example. Reference generator circuit 303 may include a threshold voltage, Vthresh, to determine when to provide reference voltage Vref1 and when to provide reference voltage Vref2. For example, Vthresh may be 0.825V, Vref1 may be 1.65V, and voltage Vref2 may be 1V. When the input voltage is 3.3V, which is above Vthresh, reference generator circuit 303 may output Vref1 (e.g., 1.65V) to the gate of transistor 302. Vref1 at the gate of transistor 302 will be shifted up across the gate-to-source voltage, Vgs2, to set the gate-to-source voltage, Vgs1, of transistor 301. Accordingly, in this state, Vgs1 is as follows:

$Vgs1=Vin-(Vref1+Vgs2).$

Applying the above example values and assuming Vgs2=0.98V, Vgs1=0.67V.

However, when the input voltage is 0V, which is below Vthresh, reference generator circuit 303 may output Vref2 (e.g., 1V) to the gate of transistor 302. Similarly, Vref2 at the gate of transistor 302 will shifted up across the gate-to-source voltage, Vgs2, to set the gate-to-source voltage, Vgs1, of transistor 301. Accordingly, in this state, Vgs1 is as follows:

$Vgs1=Vin-(Vref2+Vgs2).$

Applying the above example values, Vgs1=−1.98V. In this example, if Vref1 were used when the input voltage is at Vin=0V, rather than Vref2, the resulting gate-to-source voltage would be Vgs1=2.63V, which may stress or even damage the device. However, by changing the reference voltage in response to changes in the input voltage, a lower gate-to-source voltage of 1.98V, for example, may be obtained, which reduces electrical stress on the device and, in this example, is an acceptable operating condition.

Figure 4:
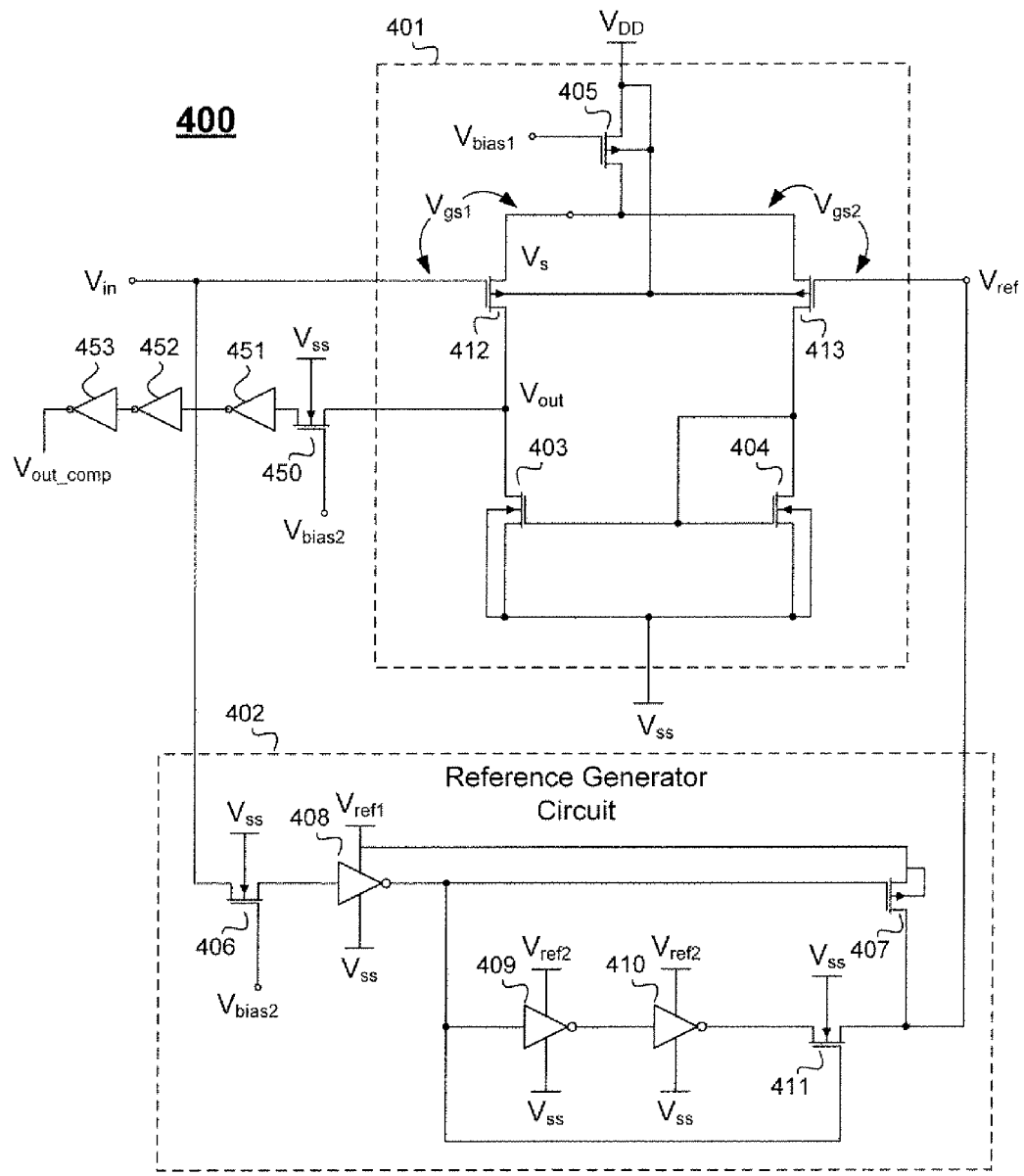
FIG. 4 illustrates a comparator circuit according to yet another embodiment of the present invention.

FIG. 4 illustrates a comparator circuit 400 according to yet another embodiment of the present invention. Comparator circuit 400 includes comparator core 401 and reference generator circuit 402. Comparator core 401 compares the input voltage, Vin, to a reference input voltage, Vref, and generates a comparator output voltage, Vout. Reference generator circuit 402 receives input voltage, Vin, and selectively couples voltages Vref1 and Vref2 to the reference input of the comparator core 401 to maintain a voltage Vgs1 within a safe range such that the gate of PMOS transistor 412 is not overstressed.

Comparator core 401 includes PMOS transistor 412, PMOS transistor 413, PMOS transistor 405, NMOS transistor 403, and NMOS transistor 404. PMOS transistors 412 and 413 are configured as a differential pair. The source terminals of PMOS transistors 412 and 413 are coupled to the drain terminal of PMOS transistor 405. The source terminal of PMOS transistor 405, the substrate terminals of PMOS transistors 412, 413, and 405 are coupled to supply voltage $V_{DD}$. The gate terminal of PMOS transistor 405 receives bias voltage, Vbias, so that transistor 405 provides a bias current to PMOS transistors 412 and 413 (i.e. the differential pair). NMOS transistors 403 and 404 are coupled in a current minor configuration and act as a load on the differential pair. The source terminals and substrate terminals of NMOS transistors 403 and 404 are coupled to supply voltage Vss (e.g., ground or 0V). The gate terminals of NMOS transistors 403 and 404 are coupled to the drain terminal of NMOS transistor 404 and the drain terminal of PMOS transistor 413 so that transistors 403 and 404 act as a current mirror load. The drain terminal of NMOS transistor 403 is coupled to the drain terminal of PMOS transistor 412, which provides the comparator output voltage, Vout.

Comparator core 401 may function as follows. The gate terminal of PMOS transistor 412 receives input voltage Vin and the gate terminal of PMOS transistor 413 receives reference voltage Vref. If voltage Vin is greater than voltage Vref, more current from PMOS transistor 405 flows through PMOS transistor 413 and NMOS transistor 404 than through PMOS transistor 412 and NMOS transistor 403, which causes voltage Vout to drop. If voltage Vin is less than voltage Vref, more current from PMOS transistor 405 flows through PMOS transistor 412 and NMOS transistor 403 than through PMOS transistor 413 and NMOS transistor 404, which causes voltage Vout to increase.

Reference generator circuit 402 includes NMOS transistor 406, PMOS transistor 407, NMOS transistor 411, and inverters 408-410. NMOS transistor 406 receives voltage Vin, and Vbias2 activates NMOS transistor 406 to couple Vin to an input terminal of inverter 408. Inverter 408 is supplied by voltage Vref1 and Vss. In this example, inverter 408 may perform the function of sensing the input voltage on a control terminal of transistor 412 and determining if the input voltage does or does not meet a particular threshold. An output terminal of inverter 408 is coupled to the gate terminals of transistors 407 and 411, and to an input terminal of inverter 409. In this example, transistors 407 and 411 may perform the function of selectively coupling reference voltages to the source terminal of transistor 412. Inverters 409 and 410 are supplied by voltage Vref2 and Vss. Inverters 409 and 410 are coupled in series, and an output terminal of inverter 410 is coupled to a drain terminal of NMOS transistor 411. A source terminal of NMOS transistor 411 is coupled to a drain terminal of PMOS transistor 407 and to the gate of PMOS transistor 413 of comparator core 401. Reference generator circuit 402 receives input voltage Vin and selectively couples voltages Vref1 and Vref2 as the reference voltage Vref of comparing circuit 401 using transistors 407 and 411.

Reference generator circuit 402 may operate as follows. Input voltage, Vin, is coupled through pass transistor 406 and sensed by inverter 408. If Vin is below a threshold set by inverter 408, the output of inverter 408 goes high and couples voltage Vref1 to deactivate PMOS transistor 407 and activate NMOS transistor 411. In this example, the threshold is a voltage, which is the trip voltage of the inverter (i.e., the voltage at which the output of the inverter switches from one state to another based on the input voltage of the inventer). It is to be understood that the threshold could be implemented in a variety of ways and may be set by either a voltage or a current. Additionally, inverter 409 receives voltage Vref1 and couples voltage Vss to the input terminal of inverter 410. In response to voltage Vss, inverter 410 couples voltage Vref2 through transistor 411 to the gate of transistor 413 to set the reference voltage, Vref, of the comparator. In this embodiment, Vref2 is less than Vref1. Accordingly, when the input voltage, Vin, at the gate of transistor 412 is low, reference generator circuit 402 produces voltage Vref2 to reduce voltage Vs and reduce stress on the comparator input transistor 412, as described above in regards to FIG. 3. If Vin is above the threshold set by inverter 408, inverter 408 couples voltage Vss to activate PMOS transistor 407 and deactivate NMOS transistor 411. PMOS transistor 407 couples voltage Vref1 to the gate of transistor 413 to set the reference voltage, Vref, of the comparator. Accordingly, when the input voltage, Vin, at the gate of transistor 412 is high, reference generator circuit 402 produces voltage Vref1. In one example embodiment, PMOS transistors 405, 412, and 413, and NMOS transistors 403 and 404 are 1.8V laterally diffused metal-oxide semiconductor ("LDMOS") transistors, and transistor 406, 407, and 411 are typical 1.8V MOS devices. The output of comparator core 401 may be coupled through transistor 450 and inverters 451-453 to other circuits on an integrated circuit at Vout_comp, for example. Inverters 451-453 may be coupled to a different power supply voltage than the comparator core, for example, and may further increase the current drive of the output.

Figure 5:
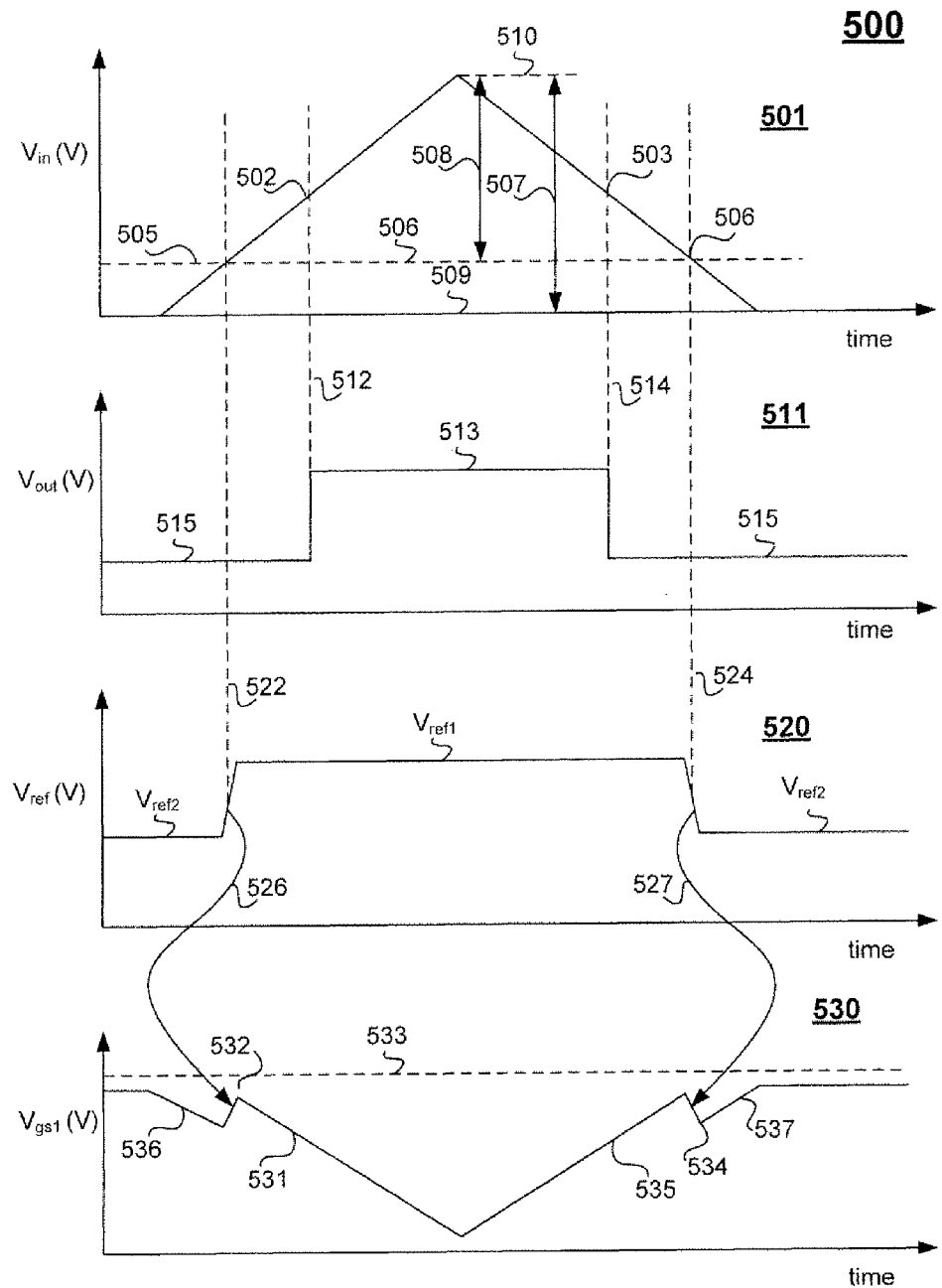
FIG. 5 illustrates a timing diagram associated with the electronic circuit of FIG. 4 according to one embodiment of the present invention.

FIG. 5 illustrates a timing diagram 500 associated with the electronic circuit of FIG. 4 according to one embodiment of the present invention. Timing diagram 500 includes waveform Vin 501 illustrating the input voltage, waveform Vout 511 illustrating the output of the comparator (i.e., Vout_comp of FIG. 4), waveform Vref 520 illustrating the different reference voltages generated, and waveform Vgs1 530 illustrating the electrical stress on transistor 412 of FIG. 4. Waveform Vin 501 shows a triangle stimulus used to illustrate the function of the comparator circuit 400 of FIG. 4. In this example, waveform. Vin 501 starts at zero volts and increases to a maximum voltage of 3.3V. Waveform Vgs1 530 ramps down at location 536 as Vin increases. Waveform Vref 520 indicates that level Vref1 is initially being provided as the reference voltage when Vin is below a threshold value 505 set by inverter 408 of FIG. 4, for example. Waveform Vout indicates a low level 515 corresponding to the condition Vin<Vref (note that Vout in FIG. 5 is Vout_comp in FIG. 4, so the polarity of the output is reversed). When waveform Vin 501 passes threshold 505, waveform Vref 520 changes at the time illustrated at 522 to indicate the change from voltage level Vref2 to voltage level Vref1. Arrow 526 indicates that the waveform Vgs1 530 is responsive to the change in waveform Vref 520 and adjusts upward to location 532 to reflect the increased reference voltage.

As waveform Vin 501 continues to increase past threshold 505, waveform Vgs1 530 continuously decreases. When waveform Vin 501 increases and is greater than Vref1, the comparator switches, and waveform Vout 511 transitions to a high level 513 at time point 512. In this illustrative diagram, waveform Vin 501 continues increasing and then begins decreasing after the apex. As waveform Vin 501 decreases and drops below Vref1 at point 503, the comparator switches again, and waveform Vout 511 transitions to a low level 515 at time point 514.

Waveform Vin 501 continues to decrease and waveform Vgs1 530 ramps up at location 535. When waveform Vin 501 passes threshold 506, waveform Vref 520 changes at location 524 to indicate that voltage level Vref2 is being provided. Arrow 527 indicates that the waveform Vgs1 530 is responsive to waveform Vref 520 and adjusts downward at 534 to reflect the reduced reference voltage and corresponding reduction in electrical stress on transistor 412. As waveform Vin 501 continues to decrease, waveform Vgs1 continues to rise at 537. As illustrated in plot 530, waveform Vgs1 does not exceed a maximum value 533 during the entire range 507 of waveform Vin 501. Additionally, during the time waveform Vin 501 is in an operating range 508, waveform Vin 501 is compared with Vref1. Accordingly, the trigger level of the comparator may be set by Vref1.

The full range 507 of the input voltage is the difference between voltage levels 509 and 510. Timing diagram 500 illustrates that by maintaining the difference between voltage level 509 and voltage level Vref2 at less than one-half of the difference between voltage levels 509 and 510, the range of voltages across Vgs1 may be reduced, thereby reducing stress on the transistor. The trigger level of the comparator may be unaffected if the threshold for switching between reference voltages (e.g., the threshold of inverter 408 of FIG. 4) is less than both Vref1 and Vref1. For example, in FIG. 4, inverter 408 switches at approximately Vref1/2, which is less than both Vref1 and Vref2.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, one or more steps of methods or processes discussed above may be performed in a different order and still achieve desirable results. Based on the above disclosure and the following claims, other arrangements, embodiments, implementations and equivalents may be employed without departing from the scope of the invention as defined by the claims.

What is claimed is:

1. An electronic comparator circuit comprising:
   a first transistor having a first terminal, a second terminal, and a control terminal, wherein the control terminal of the first transistor is configured to receive an input voltage;
   a second transistor having a first terminal, a second terminal, and a control terminal, wherein the first terminal of the second transistor is coupled to the first terminal of the first transistor;
   a reference generator circuit, wherein the reference generator circuit has
   (i) an input that is coupled to the control terminal of the first transistor, and wherein the input of the reference generator circuit is configured to receive the input voltage, and
   (ii) an output that is coupled to the control terminal of the second transistor,
   wherein the input voltage transitions from a first voltage level to a second voltage level, such that (i) the first voltage level and the second voltage level respectively form a minimum value and a maximum value of the input voltage, (ii) the first voltage level is lower than a threshold voltage, (iii) the second voltage level is higher than the threshold voltage,
   wherein a voltage difference between the first voltage level and the second voltage level is greater than a safe range of the first transistor between the control terminal and the first terminal,
   wherein in response to the input voltage being higher than the threshold voltage, the reference generator circuit generates a first reference voltage at the control terminal of the second transistor, wherein the first reference voltage is selected such that a difference between (i) the first reference voltage and (ii) the first voltage level is substantially equal to half of a difference between (i) the first voltage level and (ii) the second voltage level, and
   wherein in response to the input voltage being lower than the threshold voltage, the reference generator circuit generates a second reference voltage, which is lower than the first reference voltage, at the control terminal of the second transistor, wherein the second reference voltage is selected such that a difference between (i) the second reference voltage and the (ii) first voltage level is substantially less than half of the difference between (i) the first voltage level and (ii) the second voltage level.

2. The electronic comparator circuit of claim 1, wherein:
   the reference generator circuit includes a third transistor to selectively couple the first reference voltage to the control terminal of the second transistor; and
   the reference generator circuit includes a fourth transistor to selectively couple the second reference voltage to the control terminal of the second transistor.

3. The electronic comparator circuit of claim 1, wherein the reference generator circuit includes an inverter to set the threshold.

4. The electronic comparator circuit of claim 1, wherein the threshold voltage is lower than each of (i) the first reference voltage and (ii) the second reference voltage.

5. The electronic comparator circuit of claim 1, wherein the transistor is a metal oxide semiconductor (MOS) transistor.

6. The electronic comparator circuit of claim 1, wherein the transistor is an LDMOS transistor.

7. A method comprising:
   sensing an input voltage on a control terminal of a first transistor, wherein the input voltage ranges from a first voltage level to a second voltage level such that (i) the first voltage level is lower than a threshold voltage and (ii) the second voltage level is higher than the threshold voltage;
   in response to the input voltage being higher than the threshold voltage,
   (A) generating a first reference voltage such that a difference between (i) the first reference voltage and (ii) the first voltage level is substantially equal to half of a difference between (i) the first voltage level and (ii) the second voltage level, and
   (B) providing the first reference voltage at the control terminal of the second transistor;
   in response to the input voltage being lower than the threshold voltage,
   (A) generating a second reference voltage such that a difference between (i) the second reference voltage and (ii) the first voltage level is substantially less than half of the difference between (i) the first voltage level and (ii) the second voltage level, and (B) providing the second reference voltage at the control terminal of the second transistor; and comparing the input voltage to a voltage level of the control terminal of the second transistor to produce an output.

8. The method of claim 7, further comprising:

activating a third transistor to couple the first reference voltage to the control terminal of the second transistor; and activating a fourth transistor to couple the second reference voltage to the control terminal of the second transistor.

9. The method of claim 7, wherein the transistor is a metal oxide semiconductor (MOS) transistor.

10. The method of claim 7, wherein the threshold voltage is lower than each of (i) the first reference voltage and (ii) the second reference voltage.

11. The method of claim 7, wherein the transistor is an LDMOS transistor.

12. The method of claim 7, wherein the threshold is set by an inverter.

13. The method of claim 7, wherein the input voltage meets the threshold if the input voltage is greater than the threshold, and the input voltage does not meet the threshold if the input voltage is less than the threshold.

\* \* \* \* \*